(12) United States Patent
Ahn et al.

(10) Patent No.: US 9,806,204 B2
(45) Date of Patent: Oct. 31, 2017

(54) SEMICONDUCTOR DEVICES

(71) Applicant: SAMSUNG ELECTRONICS CO., LTD., Suwon-si, Gyeonggi-do (KR)

(72) Inventors: Sung-Soo Ahn, Hwaseong-si (KR); O Ik Kwon, Seongnam-si (KR); Bum-Soo Kim, Incheon (KR); Hyun-Sung Kim, Siheung-si (KR); Kyoung-Sub Shin, Seongnam-si (KR); Min-Kyung Yun, Seoul (KR); Seung-Pil Chung, Seoul (KR); Won-Bong Jung, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/536,250

(22) Filed: Nov. 7, 2014

(65) Prior Publication Data

US 2015/0054054 A1    Feb. 26, 2015

Related U.S. Application Data

(62) Division of application No. 13/599,233, filed on Aug. 30, 2012, now Pat. No. 8,883,588.

(30) Foreign Application Priority Data

Nov. 30, 2011    (KR) .................. 10-2011-0126460

(51) Int. Cl.
*H01L 29/78*    (2006.01)
*H01L 29/66*    (2006.01)
(Continued)

(52) U.S. Cl.
CPC ...... *H01L 29/7883* (2013.01); *H01L 21/7682* (2013.01); *H01L 27/11521* (2013.01);
(Continued)

(58) Field of Classification Search
CPC .............. H01L 21/7682; H01L 21/764; H01L 29/42324
See application file for complete search history.

(56) References Cited

U.S. PATENT DOCUMENTS 5,486,715 A * 1/1996 Zommer ............. H01L 23/5222
257/341
5,792,687 A * 8/1998 Jeng .................. H01L 27/10852
257/E21.648

(Continued)

FOREIGN PATENT DOCUMENTS

KR    10-2002-0006411 A    1/2002
KR    10-2002-0015934 A    3/2002
(Continued)

OTHER PUBLICATIONS

Quirk, Michael and Serda, Julian, Semiconductor Manufacturing Technology, Prentice Hall, pp. 275, 465 (2001).
(Continued)

*Primary Examiner* — Jesse Y Miyoshi
*Assistant Examiner* — John Bodnar
(74) *Attorney, Agent, or Firm* — Lee & Morse, P.C.

(57) ABSTRACT

A method of manufacturing a semiconductor device, the method including forming a tunnel insulating layer on an upper surface of a substrate, forming gate patterns on an upper surface of the tunnel insulating layer, forming capping layer patterns on sidewalls of the gate patterns and on the upper surface of the tunnel insulating layer, etching a portion of the tunnel insulating layer that is not covered with the gate patterns or the capping layer patterns to form a tunnel insulating layer pattern, and forming a first insulating layer on the upper surface of the substrate to cover the gate patterns, the capping layer patterns, and the tunnel insulating (Continued)

layer pattern, wherein the first insulating layer has an air gap between the capping layer patterns.

16 Claims, 18 Drawing Sheets

(51) Int. Cl.
  *H01L 29/788*   (2006.01)
  *H01L 21/768*   (2006.01)
  *H01L 27/11521*   (2017.01)
  *H01L 29/423*   (2006.01)

(52) U.S. Cl.
  CPC .. *H01L 29/42324* (2013.01); *H01L 29/42364* (2013.01); *H01L 29/66825* (2013.01); *H01L 29/7881* (2013.01)

(56) References Cited

U.S. PATENT DOCUMENTS

| | | | |
|---|---|---|---|
| 5,795,811 A * | 8/1998 | Kim | H01L 21/76224 |
| | | | 257/E21.546 |
| 5,869,396 A * | 2/1999 | Pan | H01L 21/28518 |
| | | | 257/E21.165 |
| 6,469,339 B1 | 10/2002 | Onakado et al. | |
| 6,555,868 B2 | 4/2003 | Shimizu et al. | |
| 7,682,900 B2 | 3/2010 | Kim et al. | |
| 7,692,234 B2 | 4/2010 | Adachi et al. | |
| 7,705,392 B2 | 4/2010 | Yonemochi et al. | |
| 2002/0009846 A1 | 1/2002 | Shimizu et al. | |
| 2003/0148583 A1 | 8/2003 | Adachi et al. | |
| 2006/0231884 A1 | 10/2006 | Yonemochi et al. | |
| 2007/0184615 A1 * | 8/2007 | Brazzelli | H01L 21/764 |
| | | | 438/266 |
| 2008/0265365 A1 * | 10/2008 | Frohberg | H01L 21/7682 |
| | | | 257/513 |
| 2009/0001444 A1 * | 1/2009 | Matsuoka | H01L 21/28273 |
| | | | 257/316 |
| 2009/0042383 A1 | 2/2009 | Kim et al. | |
| 2009/0325369 A1 | 12/2009 | Kim et al. | |
| 2011/0309430 A1 * | 12/2011 | Purayath | H01L 21/28273 |
| | | | 257/321 |
| 2012/0049318 A1 * | 3/2012 | Kawamata | H01L 21/76232 |
| | | | 257/508 |
| 2012/0280300 A1 | 11/2012 | Kim et al. | |

FOREIGN PATENT DOCUMENTS

| | | |
|---|---|---|
| KR | 10-2006-0002027 A | 1/2006 |
| KR | 10-2010-0003164 A | 1/2010 |

OTHER PUBLICATIONS

Office Action dated Jun. 7, 2017 for Korean Patent Application No. 10-2011-0126460.

* cited by examiner

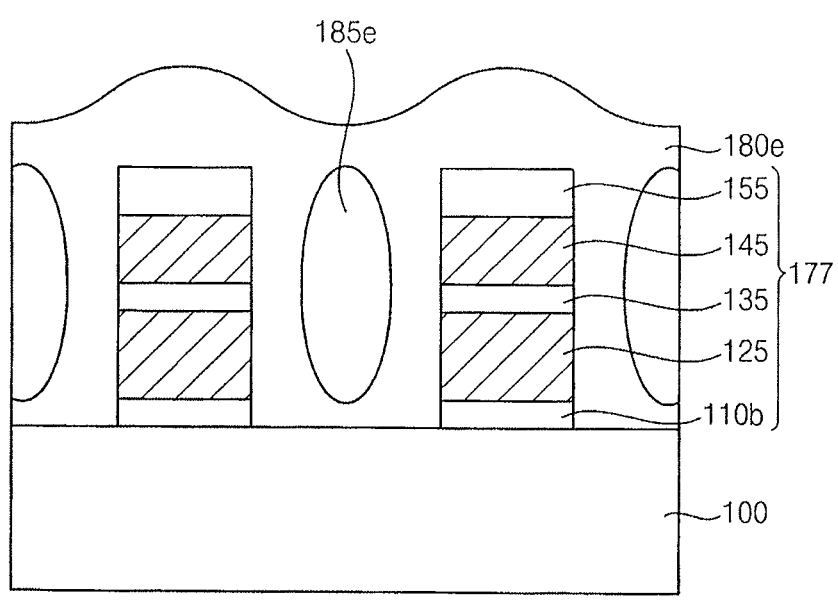

SECOND DIRECTION
⊗ ⟶ FIRST DIRECTION

SECOND DIRECTION
⊗ ⟶ FIRST DIRECTION

SECOND DIRECTION
⊗ → FIRST DIRECTION

SEMICONDUCTOR DEVICES

CROSS REFERENCE TO RELATED APPLICATIONS

This is a divisional application based on pending application Ser. No. 13/599,233, filed Aug. 30, 2012, the entire contents of which is hereby incorporated by reference.

Korean Patent Application No. 10-2011-0126460, filed on Nov. 30, 2011, in the Korean Intellectual Property Office (KIPO), and entitled "Semiconductor Devices and Methods of Manufacturing the Semiconductor Devices," is incorporated by reference herein in its entirety.

BACKGROUND

Embodiments relate to semiconductor devices and methods of manufacturing the semiconductor devices. More particularly, embodiments relate to semiconductor device having an air gap, and methods of manufacturing the semiconductor devices.

SUMMARY

Embodiments are directed to a method of manufacturing a semiconductor device, the method including forming a tunnel insulating layer on an upper surface of a substrate, forming gate patterns on an upper surface of the tunnel insulating layer, forming capping layer patterns on sidewalls of the gate patterns and on the upper surface of the tunnel insulating layer, etching a portion of the tunnel insulating layer that is not covered with the gate patterns or the capping layer patterns to form a tunnel insulating layer pattern, and forming a first insulating layer on the upper surface of the substrate to cover the gate patterns, the capping layer patterns, and the tunnel insulating layer pattern, wherein the first insulating layer has an air gap between the capping layer patterns.

Forming each of the gate patterns may include forming a floating gate on the upper surface of the tunnel insulating layer, forming a dielectric layer pattern on an upper surface of the floating gate, and forming a control gate on an upper surface of the dielectric layer pattern.

The air gap may have a bottom that is lower than the upper surface of the floating gate of each of the gate patterns.

The air gap may have a bottom that is lower than a lower surface of the floating gate of each of the gate patterns.

The tunnel insulating layer may include a silicon oxide, and the capping layer patterns may include substantially a same silicon oxide as the silicon oxide included in the tunnel insulating layer.

The tunnel insulating layer may be formed by thermally oxidizing the substrate, and the capping layer patterns may be formed by thermally oxidizing the gate patterns.

The first insulating layer may include at least one selected from the group of tetra ethyl ortho silicate (TEOS), plasma enhanced-tetra ethyl ortho silicate (PE-TEOS), and undoped silicate glass (USG).

The method may further include etching an exposed portion of the substrate, wherein the exposed portion of the substrate may be exposed by portions of the tunnel insulating layer pattern that are spaced apart from each other.

The first insulating layer may be formed on upper surfaces of the capping layer patterns and on upper surfaces of the gate patterns, and the first insulating layer may overhang the upper surfaces of the capping layer patterns.

The method may further include removing the capping layer patterns and a part of the tunnel insulating layer pattern that is under the capping layer patterns.

The capping layer patterns and the part of the tunnel insulating layer pattern under the capping layer patterns may be removed using a HF solution or a buffer oxide etchant (BOE) solution.

The method may further include partially removing the first insulating layer to expose upper portions of the gate patterns, covering the exposed upper portions of the gate patterns with a conductive layer, reacting the exposed upper portions of the gate patterns with the conductive layer to form a conductive layer pattern, and covering the conductive layer pattern with a second insulating layer, wherein at least a portion of a second air gap may be defined by the second insulating layer and the second air gap may be formed between the gate patterns.

The second insulating layer may be formed on upper surfaces of the conductive layer pattern and on upper surfaces of the first insulating layer, and a lower portion of the second air gap may be defined by the first insulating layer and an upper portion of the second air gap is defined by the second insulating layer.

The second insulating layer may be formed on upper surfaces of the conductive layer pattern and on upper surfaces of the first insulating layer, and the second air gap may be defined only by the second insulating layer.

Embodiments are also directed to a semiconductor device, including a tunnel insulating layer pattern on an upper surface of a substrate, gate patterns on an upper surface of the tunnel insulating layer pattern, capping layer patterns on sidewalls of the gate patterns and on the upper surface of the tunnel insulating layer pattern, and an insulating layer on the upper surface of the substrate, the gate patterns, the capping layer patterns, and the tunnel insulating layer pattern, wherein the insulating layer has an air gap between the capping layer patterns.

The tunnel insulating layer pattern may have a first portion that is not covered with the gate patterns or the capping layer patterns, and a second portion that is covered with the gate patterns or the capping layer patterns, and the first portion may have an upper surface lower than that of the second portion.

Each of the gate patterns may include a floating gate on the upper surface of the tunnel insulating layer, a dielectric layer pattern on an upper surface of the floating gate, and a control gate on an upper surface of the dielectric layer pattern, and wherein the air gap may have a bottom that is lower than the upper surface of the floating gate of each of the gate patterns.

Embodiments are also directed to a semiconductor device, including gate patterns on an upper surface of a substrate, each of the gate patterns including a floating gate, and a first insulating layer on the gate patterns, the first insulating layer defining at least a portion of an air gap that is between the gate patterns, and the air gap having a bottom that is lower than a lower surface of the floating gate of each of the gate patterns.

The semiconductor device may further include a second insulating layer on the gate patterns, wherein a lower portion of the air gap may be defined by the first insulating layer and an upper portion of the air gap may be defined by the second insulating layer.

The air gap may be defined only by the first insulating layer.

BRIEF DESCRIPTION OF THE DRAWINGS

Features will become apparent to those of ordinary skill in the art by describing in detail exemplary embodiments with reference to the attached drawings in which:

FIG. 4 illustrates a cross-sectional view of a semiconductor device according to an embodiment;

DETAILED DESCRIPTION

Figure 1A:
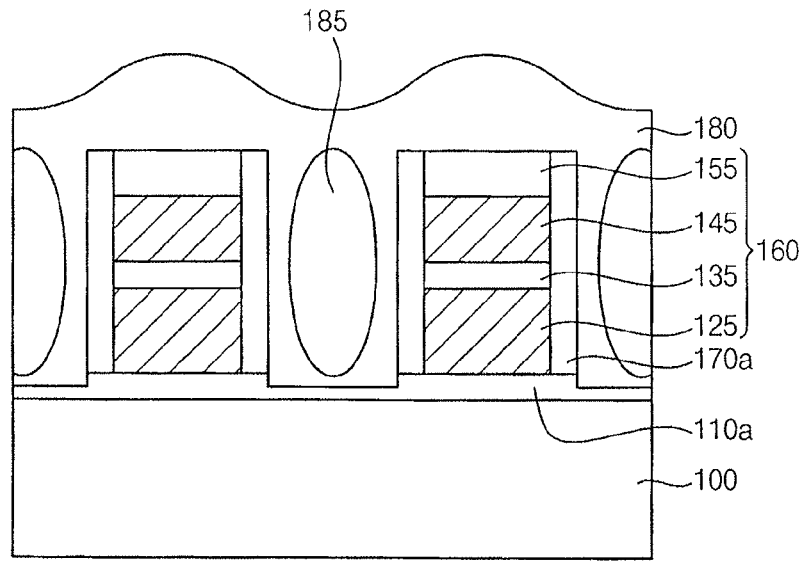
FIG. 1A illustrates a cross-sectional view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer and/or section from another elements, components, regions, layers and/or sections. Thus, a first element, component, region, layer and/or section discussed below could be termed a second element, component, region, layer and/or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the embodiments. As used herein, the singular forms "a," "an" and "the" are intended to include the plural forms as well, unless the context clearly indicates otherwise.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

FIG. 1A illustrates a cross-sectional view of a semiconductor device according to an embodiment.

Referring to FIG. 1A, a semiconductor device may include a tunnel insulating layer pattern 110a, gate patterns 160, and capping layer patterns 170a. The tunnel insulating layer pattern 110a may be formed on an upper surface of a substrate 100. The gate patterns 160 may be formed on an upper surface of the tunnel insulating layer pattern 110a. The capping layer patterns 170a may be formed on sidewalls of the gate patterns 160 and the upper surface of the tunnel insulating layer pattern 110a.

The substrate 100 may include a semiconductor substrate such as, e.g., a silicon substrate, a silicon-germanium substrate, a silicon-on-insulator (SOI) substrate, a germanium-on-insulator (GOI) substrate, etc. The substrate 100 may be extended in a first direction. The substrate 100 may have an active region and a field region defined by isolation layers (not shown), which may be arranged in a second direction substantially perpendicular to the first direction.

The tunnel insulating layer pattern 110a may be formed in the active region of the substrate 100. The tunnel insulating layer pattern 110a may include an oxide (e.g., silicon oxide), an oxynitride (e.g., silicon oxynitride), a silicon oxide doped with impurities, a material having a low dielectric constant, etc.

Each of the gate patterns 160 may include a floating gate 125, a dielectric layer pattern 135, a control gate 145, and a hard mask 155. The floating gate 125 may be formed on the upper surface of the tunnel insulating layer pattern 110a. The dielectric layer pattern 135 may be formed on an upper surface of the floating gate 125. The control gate 145 may be formed on an upper surface of the dielectric layer pattern 135. The hard mask 155 may be formed on an upper surface of the control gate 145. The gate patterns 160 may be extended in the first direction. The gate patterns 160 may be used as a word line of a memory device.

The floating gate 125 may include polysilicon doped with impurities, or metal having a high work function (e.g., tungsten, titanium, cobalt, nickel, etc.).

The dielectric layer pattern 135 may have an oxide/nitride/oxide (ONO) structure. Alternatively, the dielectric layer pattern 135 may include a metal oxide having a high dielectric constant. Examples of the metal oxide may include hafnium oxide, titanium oxide, tantalum oxide, zirconium oxide, aluminum oxide, etc. These may be used alone or in a combination thereof.

The control gate 145 may include a polysilicon doped with impurities, a metal, metal nitride, a metal silicide, etc. The control gate 145 may have an upper portion doped with polysilicon.

The hard mask 155 may include silicon nitride, silicon oxynitride, etc.

The capping layer patterns 170a may be formed on the sidewall of each of the gate patterns 160 and the upper surface of the tunnel insulating layer pattern 110a. The capping layer patterns 170a may include silicon oxide that is substantially the same as, or similar to, the material of the tunnel insulating layer pattern 110a. For example, the capping layer patterns 170a may include an atomic layer deposition (ALD) oxide.

Alternatively, a charge-trapping layer pattern, a blocking layer pattern, and a gate electrode may be sequentially stacked on the upper surface of the tunnel insulating layer pattern 110a in place of the each of the floating gate 125, the dielectric layer pattern 135, and the control gate 145, respectively.

The tunnel insulating layer pattern 110a may have a first portion and a second portion. The first portion of the tunnel insulating layer pattern 110a may not be covered with the gate patterns 160 and the capping layer patterns 170a. That is, the first portion of the tunnel insulating layer pattern 110a may be exposed through the gate patterns 160 and the capping layer patterns 170a. In contrast with the first portion, the second portion of the tunnel insulating layer pattern 110a may be covered with the gate patterns 160 and/or the capping layer patterns 170a. The first portion of the tunnel insulating layer pattern 110a may have an upper surface lower than that of the second portion of the tunnel insulating layer pattern 110a.

An insulating layer 180 may be formed on the tunnel insulating layer pattern 110a to cover the gate patterns 160 and the capping layer patterns 170a. The insulating layer 180 may include a silicon oxide having low step coverage characteristic such as, e.g., tetra ethyl ortho silicate (TEOS), plasma enhanced-tetra ethyl ortho silicate (PE-TEOS), undoped silicate glass (USG), etc. Further, the tunnel insulating layer pattern 110a may include a material having a low dielectric constant such as, e.g., SiOF, SiOC, SiBN, SiBCN, etc.

An air gap 185 may be formed in a portion of the insulating layer 180 between the adjacent capping layer patterns 170a. The air gap 185 may have a bottom at least lower than the upper surface of the floating gate 125. Particularly, the bottom of the air gap 185 may also be positioned lower than a lower surface of the floating gate 125. Further, the air gap 185 may have a top at least higher than a lower surface of the control gate 145. Particularly, the top of the air gap 185 may also be positioned higher than the upper surface of the control gate 145.

The first portion of the tunnel insulating layer pattern 110a, which may not be covered with the gate patterns 160 and the capping layer patterns 170a, may have the upper surface lower than that of the second portion of the tunnel insulating layer pattern 110a, which may be covered with the gate patterns 160 and the capping layer patterns 170a, so that the bottom of the air gap 180 may be sufficiently extended between the adjacent floating gates 125. Thus, a parasitic capacitance and/or a tunnel coupling may be substantially prevented between the adjacent floating gates 125.

Figure 1B:
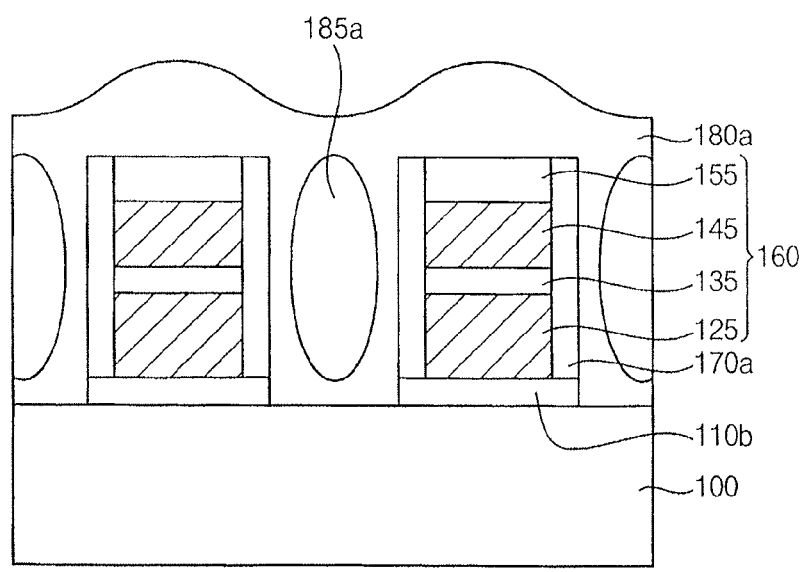
FIG. 1B illustrates a cross-sectional view of a semiconductor device according to an embodiment.

FIG. 1B illustrates a cross-sectional view of a semiconductor device according to an embodiment.

The semiconductor device illustrated in FIG. 1B may include elements substantially the same as those of the semiconductor device illustrated in FIG. 1A. Thus, the same reference numerals may refer to the same elements and any further discussion with respect to the same elements will not be repeated.

Referring to FIG. 1B, a tunnel insulating layer pattern 110b may not exist between the capping layer patterns 170a. That is, the first portion of the insulating layer pattern 110a in FIG. 1A may be completely removed to form the tunnel insulating layer pattern 110b in FIG. 1B. Thus, the tunnel insulating layer pattern 110b may be in portions that are isolated from each other in the first direction.

The insulating layer 180a may be formed on the upper surface of the substrate 100 and the insulating layer 180a may make contact with the upper surface of the substrate 100. An air gap 185a may be formed in the insulating layer 180a between the capping layer patterns 170a. Therefore, if a space between the capping layer patterns 170a in FIG. 1B is relatively larger than the space between the capping layer patterns 170 in FIG. 1A (by removing the first portion of the tunnel insulating layer pattern 110b), the air gap 185a in the space between the capping layer patterns 170a may have a size relatively larger than that of the air gap 185 in FIG. 1A.

Figure 2:
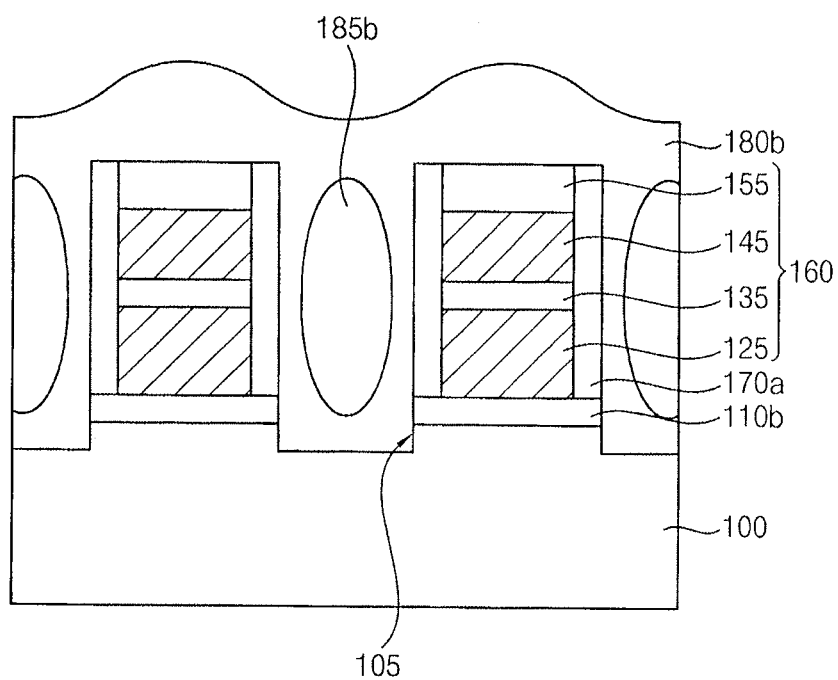
FIG. 2 illustrates a cross-sectional view of a semiconductor device according to an embodiment.

FIG. 2 illustrates a cross-sectional view of a semiconductor device according to an embodiment.

The semiconductor device illustrated in FIG. 2 may include elements substantially the same as those of the semiconductor device illustrated in FIG. 1B. Thus, the same reference numerals may refer to the same elements and any further discussion with respect to the same elements will not be repeated.

Referring to FIG. 2, an upper portion of a substrate 100 that is not be covered with the tunnel insulating layer pattern 110b may be removed to form a trench 105. An air gap 185b in the insulating layer 180b between the capping layer patterns 170a may have a bottom substantially coplanar with the upper surface of the substrate 100, and thus a parasitic capacitance and/or a tunnel coupling may not be substantially prevented between the adjacent floating gates 125.

Figure 3A:
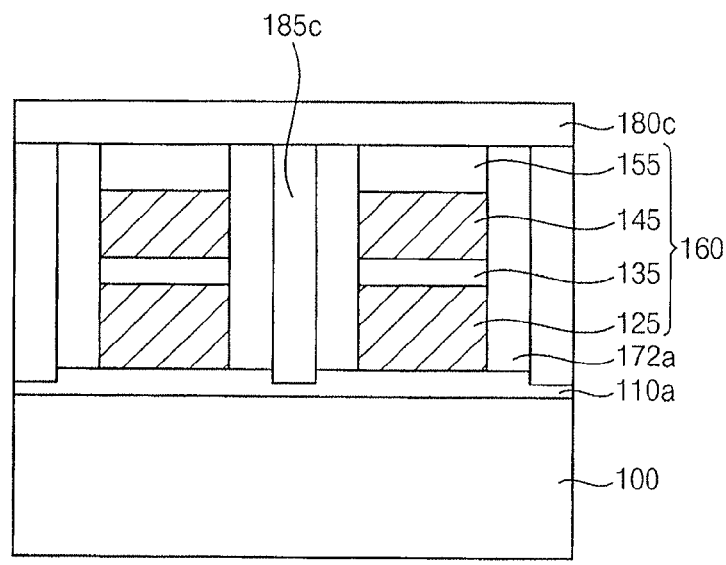
FIG. 3A illustrates a cross-sectional view of a semiconductor device according to an embodiment.

FIG. 3A illustrates a cross-sectional view of a semiconductor device according to an embodiment.

The semiconductor device illustrated in FIG. 3 may include elements substantially the same as those of the semiconductor device illustrated in FIG. 1A. Thus, the same reference numerals may refer to the same elements and any further discussion with respect to the same elements will not be repeated.

Referring to FIG. 3A, an insulating layer 180c may be formed on the capping layer patterns 172a and the gate patterns 160 to seal the space defined by the adjacent capping layer patterns 172a and the tunnel insulating layer pattern 110a. That is, if the insulating layer 180c includes a material having low step coverage characteristic, the insulating layer 180c may overhang the capping layer patterns 172a.

Thus, an air gap 185c may be defined by the insulating layer 180c, the capping layer patterns 172a, and the tunnel insulating layer pattern 110a.

Figure 3B:
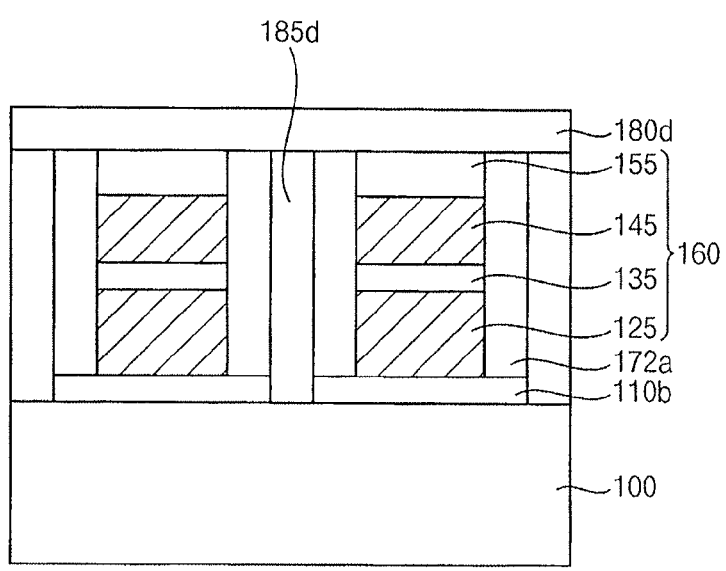
FIG. 3B illustrates a cross-sectional view of a semiconductor device according to an embodiment.

FIG. 3B illustrates a cross-sectional view of a semiconductor device according to an embodiment.

The semiconductor device illustrated in FIG. 3B may include elements substantially the same as those of the semiconductor device illustrated in FIG. 1B. Thus, the same reference numerals may refer to the same elements and any further discussion with respect to the same elements will not be repeated.

Referring to FIG. 3B, an insulating layer 180d may be formed on the capping layer patterns 172a and the gate patterns 160 to seal the space defined by the adjacent capping layer patterns 172a and the tunnel insulating layer pattern 110b. That is, if the insulating layer 180d includes a material having low step coverage characteristic, the insulating layer 180d may overhang the capping layer patterns 172a.

Thus, an air gap 185d may be defined by the insulating layer 180d, the capping layer patterns 172a, the tunnel insulating layer pattern 110b, and the substrate 100.

FIG. 4 illustrates a cross-sectional view of a semiconductor device according to an embodiment.

The semiconductor device illustrated in FIG. 4 may include elements substantially the same as those of the semiconductor device illustrated in FIG. 1B. Thus, the same reference numerals may refer to the same elements and any further discussion with respect to the same elements will not be repeated.

Referring to FIG. 4, the semiconductor device may not include the capping layer patterns. Thus, a gate structure 177 may be formed on the upper surface of the substrate 100. The gate structure 177 may include the tunnel insulating layer pattern 110b, the floating gate 124, the dielectric layer pattern 135, the control gate 145, and the hard mask 155 sequentially stacked.

An insulating layer 180e may be formed on the upper surface of the substrate 100 to cover the gate structure 177. An air gap 185e may be formed in the insulating layer 180e between the gate structures 177.

Figure 5A:
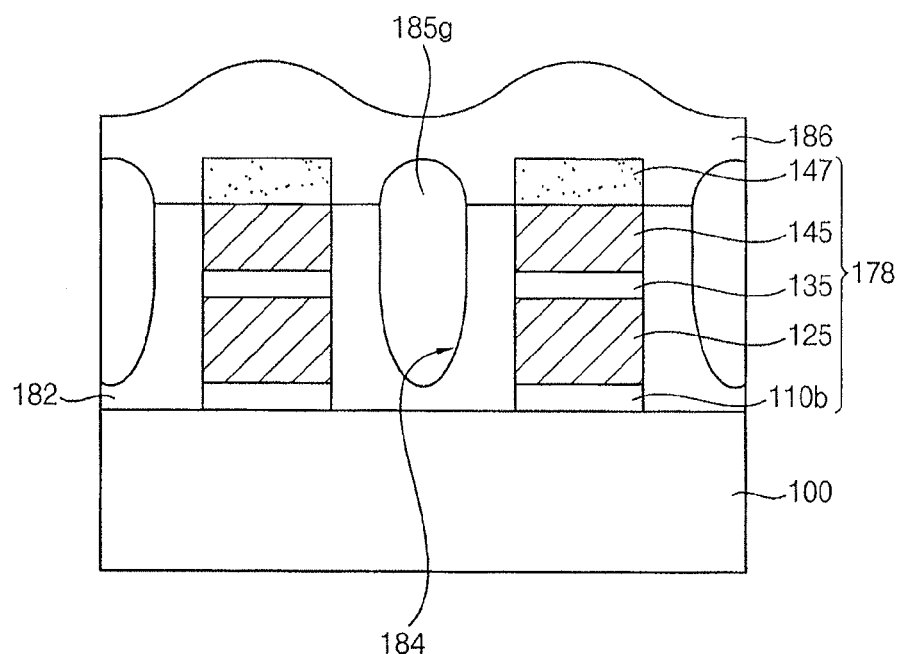
FIG. 5A illustrates a cross-sectional view of a semiconductor device according to an embodiment.

FIG. 5A illustrates a cross-sectional view of a semiconductor device according to an embodiment.

Referring to FIG. 5A, a gate structure 178 may be formed on the upper surface of the substrate 100. The gate structure 178 may include a tunnel insulating layer pattern 110b, a floating gate 125, a dielectric layer pattern 135, a control gate 145, and a conductive layer pattern 147. The conductive layer pattern 147 may include a metal silicide such as, e.g., cobalt silicide, nickel silicide, etc.

A first insulating layer pattern 182 may be formed on the upper surface of the substrate 100 to cover sidewalls of the tunnel insulating layer pattern 110b, the floating gate 125, the dielectric layer pattern 135, and the control gate 145. A recess 184 may be formed at an upper portion of the first insulating layer pattern 182 between the gate structures 178.

A second insulating layer 186 may cover an upper surface and a sidewall of the conductive layer pattern 147. Thus, an air gap 185g defined by the first insulating layer pattern 182 and the second insulating layer pattern 186 may be formed between the adjacent gate structures 178. That is, the air gap 185g may have an upper portion defined by the second insulating layer pattern 186, and a lower portion defined by the first insulating layer pattern 182. The lower portion of the air gap 185g may correspond to the recess 184.

The first insulating layer pattern 182 and the second insulating layer pattern 186 may include a silicon oxide having low step coverage characteristic such as, e.g., TEOS, PE-TEOS, USG, etc.

Figure 5B:
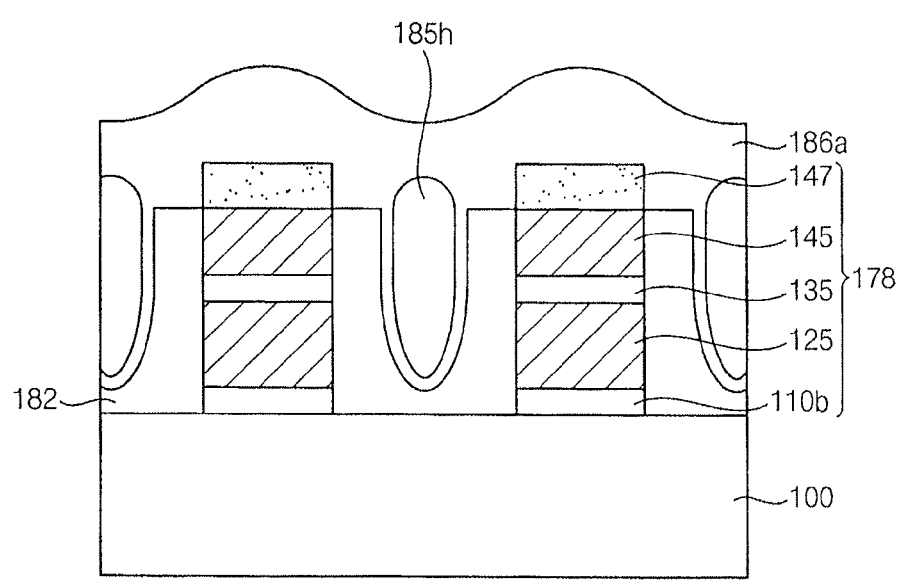
FIG. 5B illustrates a cross-sectional view of a semiconductor device according to an embodiment.

FIG. 5B illustrates a cross-sectional view of a semiconductor device according to an embodiment.

The semiconductor device illustrated in FIG. 5B may include elements substantially the same as those of the semiconductor device illustrated in FIG. 5A. Thus, the same reference numerals may refer to the same elements and any further discussion with respect to the same elements will not be repeated.

Referring to FIG. 5B, a second insulating layer 186a may cover an upper surface of the first insulating layer pattern 182, and an upper surface and a sidewall of the conductive layer pattern 147. Thus, an air gap 185h may be formed in the second insulating layer 186a between the adjacent gate structures 178. That is, the air gap 185h may be defined by only the second insulating layer pattern 186a (in contrast with the air gap 185g illustrated in FIG. 5A).

FIGS. 6 to 8, 9A, 9B, 10A, and 10B illustrate cross-sectional views of a method of manufacturing the semiconductor device in FIGS. 1A and 1B according to an embodiment.

Figure 6:
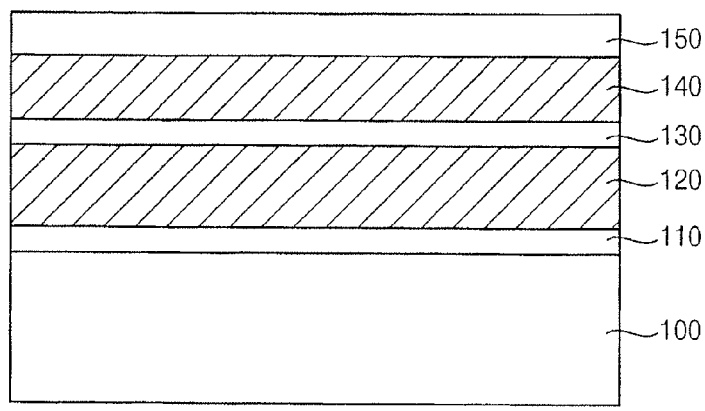
FIGS. 6 to 8, 9A, 9B, 10A, and 10B illustrate cross-sectional views of a method of manufacturing a semiconductor device according to an embodiment.

Referring to FIG. 6, a tunnel insulating layer 110, a floating gate layer 120, a dielectric layer 130, a control gate layer 140, and a hard mask layer 150 may be sequentially formed on a substrate 100.

The substrate 100 may include a semiconductor substrate such as, e.g., a silicon substrate, a germanium substrate, an SOI substrate, a GOI substrate, etc. The substrate 100 may include a well that is doped with p-type impurities or n-type impurities.

The tunnel insulating layer 110 may be formed by a chemical vapor deposition (CVD) process, a low pressure chemical vapor deposition (LPCVD) process, a plasma enhanced chemical vapor deposition (PECVD) process, a spin coating process, etc., and the proves may use a material having a low dielectric constant such as, e.g., an oxide (e.g., silicon oxide), an oxynitride (e.g., silicon oxynitride), a silicon oxide doped with impurities, a material having a low dielectric constant, etc.

Alternatively, the tunnel insulating layer 110 may be formed by thermally oxidizing the substrate 100.

The floating gate layer 120 may include polysilicon doped with impurities. For example, the floating gate layer 120 may be formed by forming a polysilicon layer on the tunnel insulating layer 110 by a CVD process, an LPCVD process, etc., and doping the polysilicon layer with impurities. Alternatively, the floating gate layer 120 may be formed by a physical vapor deposition (PVD) process, a sputtering process, an atomic layer deposition (ALD) process, a CVD process, etc., and the process may use a metal having a high work function such as, e.g., tungsten, titanium, cobalt, nickel, etc.

The dielectric layer 130 may include an ONO structure. Alternatively, the dielectric layer 130 may include a metal oxide having a high dielectric constant (e.g., so as to increase a capacitance and to improve a leakage current characteristic). Examples of the metal oxide may include hafnium oxide, titanium oxide, tantalum oxide, zirconium oxide, aluminum oxide, etc. These may be used alone or in a combination thereof.

The control gate layer 140 may be formed by a PVD process, a sputtering process, an ALD process, a CVD process, etc., and the process may use a metal, a metal nitride, a metal silicide, etc. The control gate layer 140 may have a stacked structure including a doped polysilicon layer and a metal layer sequentially stacked. The control gate layer 140 may have an upper portion including polysilicon doped with impurities.

The hard mask layer 150 may be formed by a CVD process, a PECVD process, an LPCVD process, a spin coating process, etc., and the process may use silicon nitride, silicon oxynitride, etc.

Alternatively, a charge-trapping layer, a blocking layer and a gate electrode layer in place of the floating gate layer 120, the dielectric layer 130 and the control gate layer 140, respectively, may be sequentially formed on the tunnel insulating layer 110.

The charge-trapping layer may include a material capable of storing charges such as, e.g., a nitride (e.g., silicon nitride), a hafnium oxide (e.g., hafnium silicon oxide), etc. The blocking layer may include a silicon oxide (e.g., silicon oxide), or a metal oxide having a high dielectric constant such as, e.g., hafnium oxide, titanium oxide, tantalum oxide, zirconium oxide, aluminum oxide, etc. The gate electrode layer may include a doped polysilicon, a metal, a metal nitride, a metal silicide, etc. The gate electrode layer may have an upper portion including polysilicon doped with impurities.

Additionally, after forming the floating gate 120, a hard mask layers (not shown) may be formed on the floating gate 120. The hard mask layers may be extended in the first direction. The hard mask layers may be arranged spaced apart from each other in the second direction. The floating gate 120, the tunnel insulating layer 110, and the substrate 100 may be etched using the hard mask layers as an etch mask to form trenches (not shown) at the upper portion of the substrate 100. The trenches may be extended in the first direction. The trenches may be arranged spaced apart from each other in the second direction.

The trenches may be filled with isolation layers (not shown). The isolation layers may include a silicon oxide (e.g., silicon oxide). The isolation layers may define the active region and the field region of the substrate 100. The tunnel insulating layer 110 and the floating gate layer 120 in the active region may be extended in the first direction.

Figure 7:
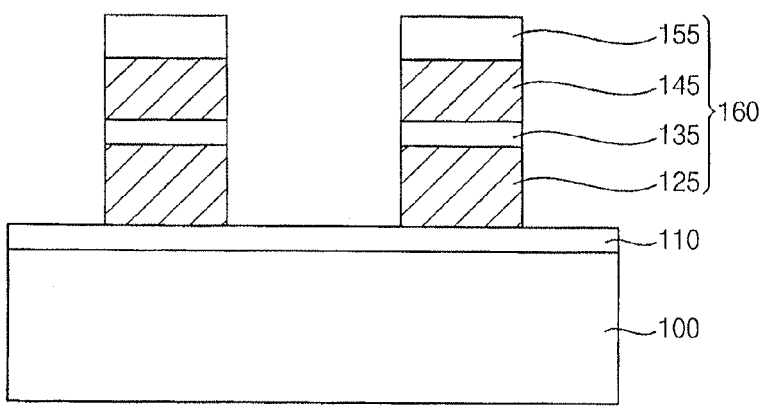

Referring to FIG. 7, the hard mask layer 150, the control gate layer 140, the dielectric layer 130, and the floating gate layer 120 may be etched to form a floating gate 125, a dielectric layer pattern 135, a control gate 145, and a hard mask 155 sequentially stacked on the tunnel insulating layer 110.

The hard mask layer 150 may be etched by a photolithography process to form the hard mask 155 on the control gate layer 140. The control gate layer 140, the dielectric layer 130 and the floating gate layer 120 may be etched using the hard mask 155 an etch mask. Here, the tunnel insulating layer 110 may not be etched. Thus, the tunnel insulating layer 110 may protect the substrate 100. Alternatively, the control gate layer 140 and the dielectric layer 130 may be etched. The floating gate layer 120 may be etched by a wet etching process or a dry etching process using an etching solution or an etching gas having a very low etching selectivity with respect to the tunnel insulating layer 110 (e.g., a very low etching selectivity with respect to a silicon oxide). Additionally, the upper portion of the tunnel insulating layer 110 may be partially etched by the etching process. In this case, the first portion of the tunnel insulating layer 110, which may not be covered with the floating gate 125, may have a thickness less than that of the second portion of the tunnel insulating layer 110, which may be covered with the floating gate 125.

By the above etching process, gate patterns 160 may be formed on the tunnel insulating layer 110. Each of the gate patterns 160 may include the floating gate 125, the dielectric layer pattern 135, the control gate 145, and the hard mask 155 sequentially stacked on the tunnel insulating layer 110.

The gate patterns 160 may be spaced apart from each other in the first direction. The floating gate 125 in each of the gate patterns 160 may have an isolated shape. The dielectric layer pattern 135 may be formed on the floating gate 125 and the isolation layers. The dielectric layer pattern 135 may be extended in the second direction. The control gate 145 and the hard mask 155 may be sequentially stacked on the dielectric layer pattern 135. The control gate 145 and the hard mask 155 may be extended in the second direction.

The gate patterns 160 may be used as a word line of a non-volatile memory device. While two gate patterns 160 are illustrated in FIG. 2, the number of gate patterns 160 may be a suitable number, e.g., 3 or more. Further, the gate patterns 160 may form a cell string. Additionally, some of the gate patterns 160, which may be used as a ground selection line (GSL) and a string selection line (SSL), may be formed at both ends of the cell string.

Figure 8:
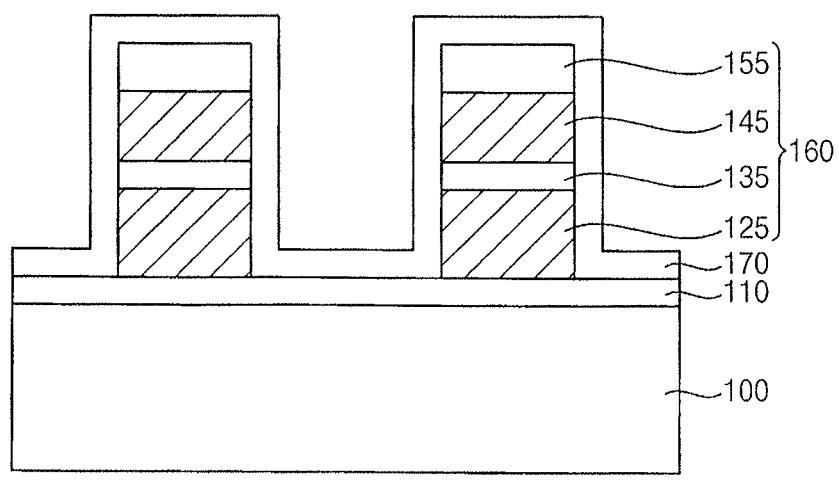

Referring to FIG. 8, a capping layer 170 may be formed on the tunnel insulating layer 110 and the gate patterns 160.

The capping layer 170 may have a uniform thickness along profiles of the tunnel insulating layer 110 and the gate patterns 160. For example, the capping layer 170 may be formed by a CVD process, an LPCVD process, a PECVD process, etc., and the process may use a silicon oxide (e.g., silicon oxide). The capping layer 170 may include a silicon oxide substantially the same as, or similar to, the silicon oxide used for forming the tunnel insulating layer 110. The capping layer 170 may not fully fill the space between the gate patterns 160 by an ALD process.

Alternatively, the capping layer 170 may be formed by thermally oxidizing the tunnel insulating layer 110 and the gate patterns 160.

Figure 9A:
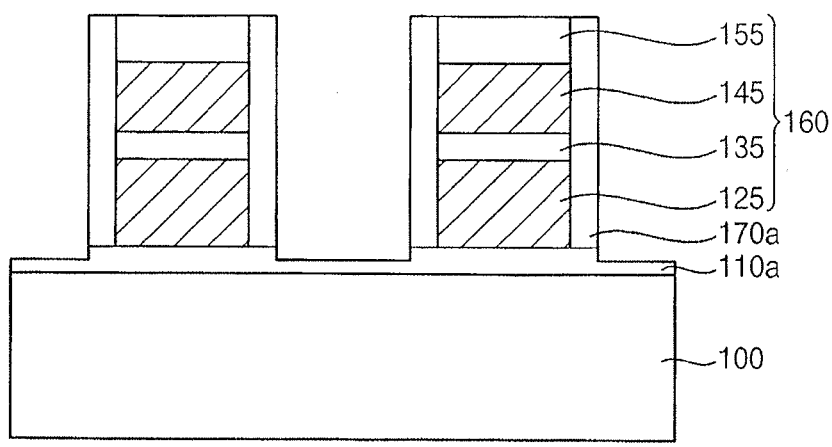

Referring to FIG. 9A, the capping layer 170 may be partially etched to form a capping layer pattern 170*a* on the sidewalls of the gate patterns 160 and the upper surface of the insulating layer 110. The capping layer 170*a* may be formed by an anisotropic etching process, an etch-back process, etc. Portions of the tunnel insulating layer 110 exposed through the adjacent capping layer patterns 170*a* may be etched together with the capping layer 170 to form a tunnel insulating layer pattern 110*a*. The capping layer 170 or the capping layer pattern 170*a* may protect the gate patterns 160 during the etching process to substantially prevent damages of the gate patterns 160.

The first portion of the tunnel insulating layer pattern 110*a*, which may not be covered with the gate patterns 160 and the capping layer pattern 170*a*, may have an upper surface lower than a lower surface of the floating gate 125.

Figure 9B:
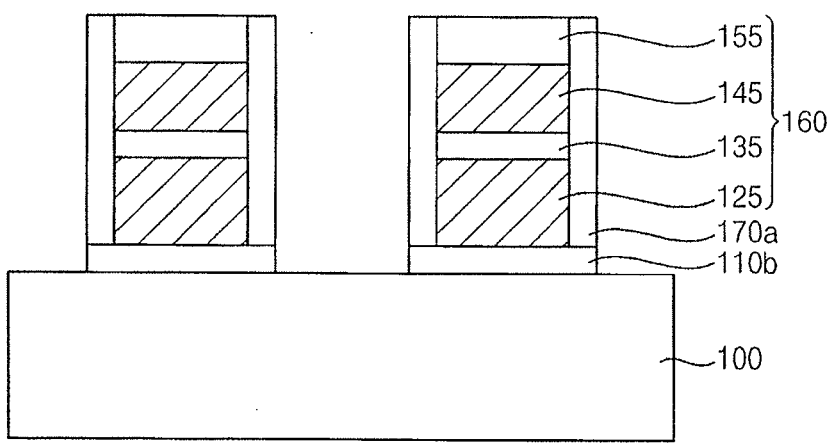

Alternatively, referring to FIG. 9B, the first portion of the tunnel insulating layer 110, which may not be covered with the gate patterns 160 and the capping layer pattern 170, may be completely removed to expose the upper surface of the substrate 100. Thus, the tunnel insulating layer patterns 110*b* may have isolated shapes spaced apart from each other in the first direction.

Figure 10A:
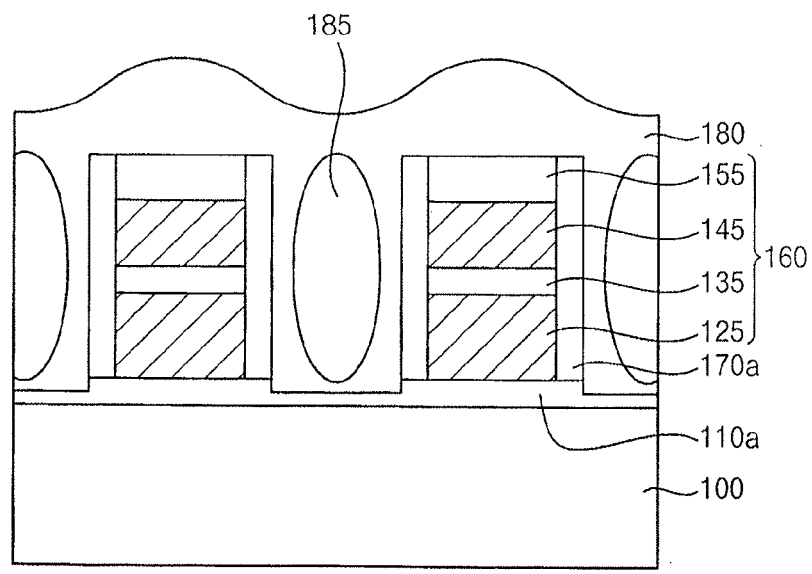

Referring to FIG. 10A, an insulating layer 180 may be formed on the tunnel insulating layer pattern 110*a* to cover the gate patterns 160 and the capping layer pattern 170*a*. The air gaps 185 may be formed in the insulating layer 180 between the adjacent gate patterns 160, and thus a parasitic capacitance and/or a tunnel coupling between the control gates 145 and the floating gates 125 may be reduced, i.e., a parasitic capacitance and/or a tunnel coupling between word lines may be reduced. The air gaps 185 may be arranged spaced apart from each other in the first direction. Each of the air gaps 185 may be extended in the second direction.

The insulating layer 180 may be formed by a CVD process, a PECVD process, an LPCVD process, etc., and the process may use a material having low step coverage characteristic so as to form the air gap 185 between the capping layer patterns 170*a*. For example, the insulating layer 180 may include a suitable silicon oxide such as, e.g., TEOS, PE-TEOS, USG, etc. These may be used alone or in a combination thereof.

Alternatively, the insulating layer 180 may be formed using a material having a dielectric constant lower than that of silicon oxide, thus reduction of the parasitic capacitance between the word lines may be achieved. For example, the material having the low dielectric constant may include SiOF, SiOC, SiBN, SiBCN, etc. These may be used alone or in a combination thereof. The air gap 185 may be formed in the insulating layer 180 between the capping layer patterns 170*a* by controlling a temperature and a pressure of a chamber in the CVD process, the PECVD process or the LPCVD process, and partial pressures of oxygen and silicon to provide the insulating layer 180 with a low burial characteristic.

The air gap 185 may have a bottom lower than at least the upper surface of the floating gate 125. Particularly, the bottom of the air gap 185 may be lower than the lower surface of the floating gate 125. Further, the air gap 185 may have a top higher than at least the lower surface of the control gate 145. Particularly, the top of the air gap 185 may be higher than the upper surface of the control gate 145.

Therefore, the first portion of the tunnel insulating layer 110, which may not be covered with the gate patterns 16*t*0 and the capping layer patterns 170*a*, may be etched to form a sufficiently large space where the air gap 185 may be to be formed. As a result, the air gap 185 may be sufficiently extended in the large space to block the parasitic capacitance between the adjacent floating gates 125.

Figure 10B:
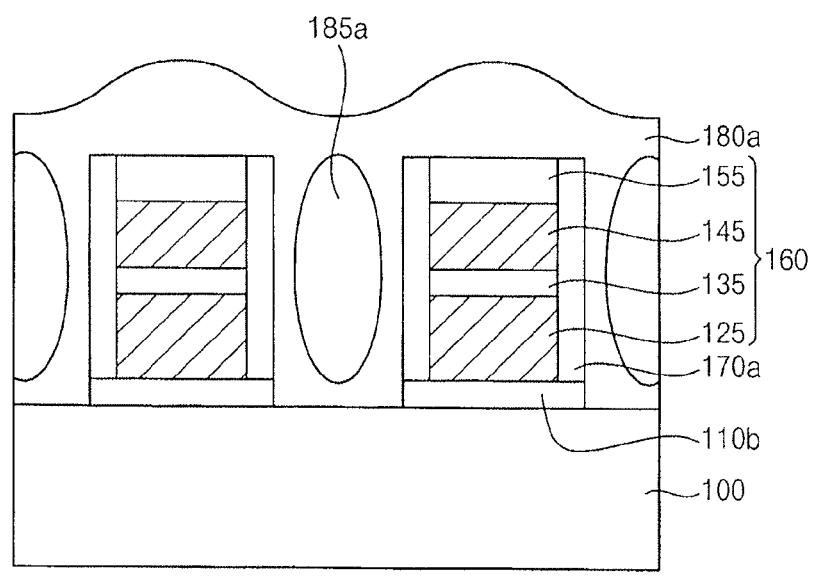

Referring to FIG. 10B, when the upper surface of the substrate 100 between the gate patterns 160 is exposed, an insulating layer 180*a* may be formed on the substrate 100 to cover the gate patterns 160, the capping layer patterns 170*a* and the tunnel insulating layer patterns 110*b*. An air gap 185*a* may be formed in the insulating layer 180*a* between the adjacent capping layer patterns 170*a* and the adjacent tunnel insulating layer patterns 110*b*. If the first portion of the tunnel insulating layer 110, which may not be covered with the gate patterns 160 and the capping layer patterns 170*a*, is completely removed, a sufficiently larger space where the air gap 185*a* may be formed.

Although not depicted in drawings, the insulating layers 180 and 180*a* may be planarized to provide the insulating layers 180 and 180*a* with flat upper surfaces. For example, the planarization process may include a chemical mechanical polishing (CMP) process, an etch-back process, etc. A protecting layer (not shown) may be formed on the planarized insulating layers 180 and 180*a*. The protecting layer may protect the gate patterns 160 if a bit line, a contact hole, etc., is formed at the insulating layers 180 and 180*a*. The protecting layer may be formed by a CVD process, a PECVD process, etc., and the process may use silicon nitride, spin-on-glass (SOG), etc.

An insulating interlayer (not shown) may cover the protecting layer and/or the insulating layers 180 and 180*a*. A bit line contact (not shown) may be formed through the insulating interlayer, the protecting layer and the insulating layers 180 and 180*a*. The bit line contact may make contact with the substrate 100. A bit line (not shown) may be formed on the insulating interlayer. The bit line may make contact with the bit line contact.

Figure 11:
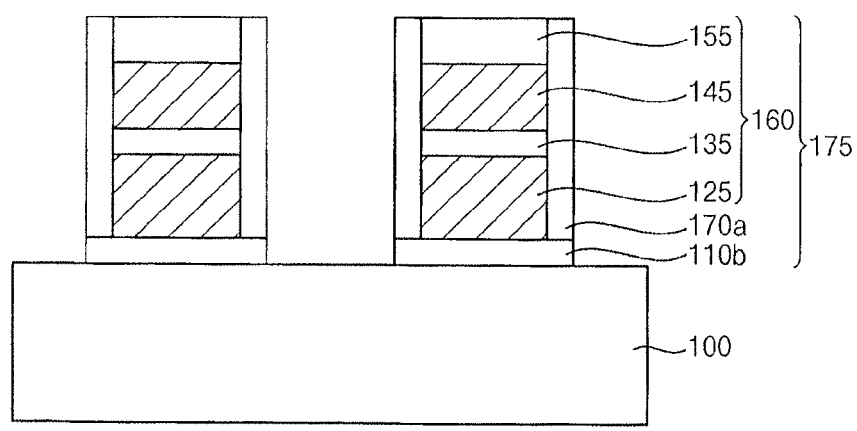
FIGS. 11 to 13 illustrate cross-sectional views of a method of manufacturing a semiconductor device according to an embodiment.
Figure 12:
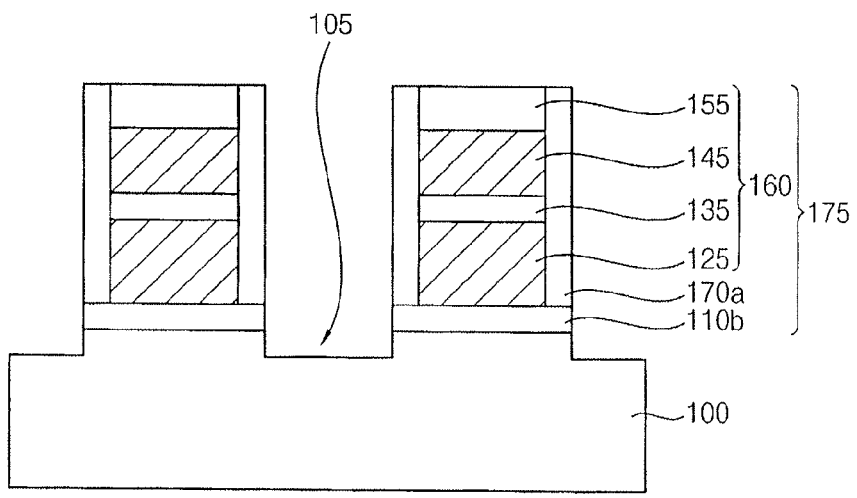
Figure 13:
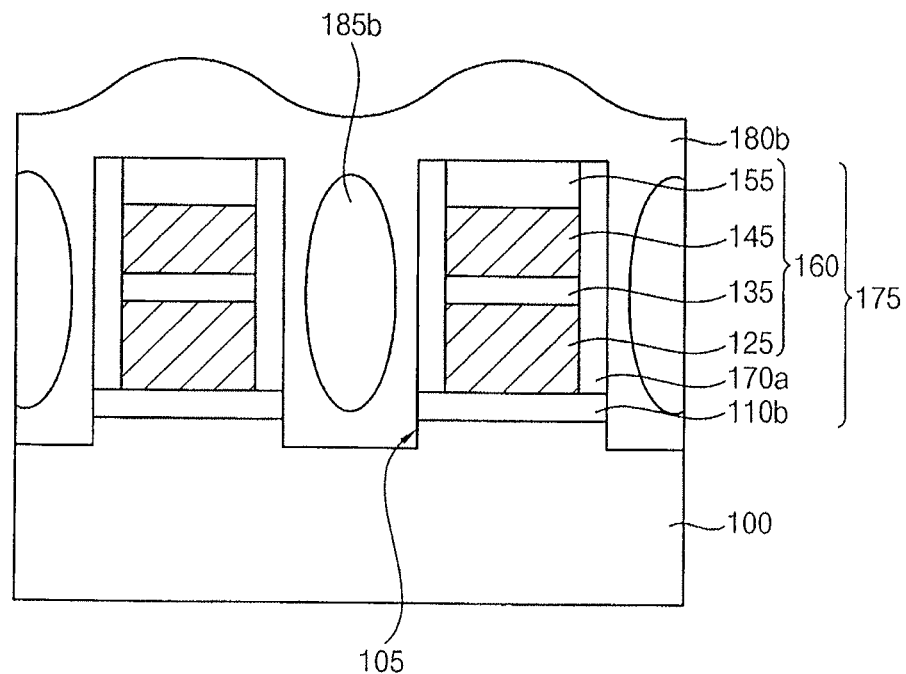

FIGS. 11 to 13 illustrate cross-sectional views of a method of manufacturing the semiconductor device in FIG. 2 according to an embodiment.

Referring to FIG. 11, processes substantially the same as, or similar to, those illustrated with reference to FIGS. 6 to 8, 9A, and 9B may be performed to form a gate structure 175. The gate structure 175 may include the gate patterns 160, a capping layer pattern 170*a*, and the tunnel insulating layer pattern 110*b*. The gate patterns 160 may be formed on the tunnel insulating layer pattern 110*b*. The capping layer pattern 170*a* may be formed on the sidewall of the gate patterns 160 and the upper surface of the tunnel insulating layer pattern 110*b*.

Referring to FIG. 12, the substrate 100 may be etched using the gate structure 175 as an etch mask to form a trench 105. The etching process may include a wet etching process, a dry etching process, etc. The etching process may use an etching solution or an etching gas having an etching selectivity between the tunnel insulating layer pattern 110*b* and the capping layer pattern 170*a*, which may include a silicon oxide (e.g., silicon oxide), and the substrate 100, which may include a silicon.

Referring to FIG. 13, a process substantially the same as, or similar to, that illustrated with reference to FIG. 10*b* may be performed to form an insulating layer 180*b* on the substrate 100 and the gate structures 175. An air gap 185*b* may be formed in the insulating layer 180*b* between the adjacent gate structures 175. The trench 105 may form a sufficiently large space such that the bottom of the air gap 185*b* may be extended. The bottom of the air gap 185*b* may be lower than the lower surface of the floating gate 125. Thus, the air gap 185b may substantially block a parasitic capacitance and/or a tunnel coupling between the adjacent floating gates 125.

The insulating layer 180b may be planarized. A protecting layer (not shown) may be formed on the planarized insulating layer 180b. An insulating interlayer (not shown) may cover the protecting layer and/or the insulating layer 180b. A bit line contact (not shown) may be formed through the insulating interlayer, the protecting layer and the insulating layer 180b. The bit line contact may make contact with the substrate 100. A bit line (not shown) may be formed on the insulating interlayer. The bit line may make contact with the bit line contact.

FIGS. 14, 15A, 15B, 16A, and 16B illustrate cross-sectional views of a method of manufacturing the semiconductor device in FIGS. 3A and 3B according to an embodiment.

Figure 14:
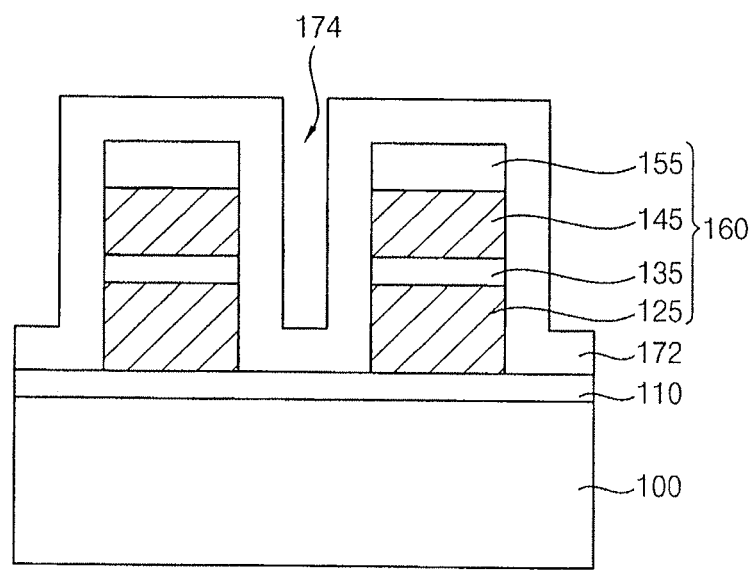
FIGS. 14, 15A, 15B, 16A, and 16B illustrate cross-sectional views of a method of manufacturing a semiconductor device according to an embodiment.

Referring to FIG. 14, processes substantially the same as, or similar to, those illustrated with reference to FIGS. 6 to 8 to form a gate patterns 160 and a capping layer 172. The gate patterns 160 may be formed on the tunnel insulating layer 110. The capping layer 172 may be formed on the tunnel insulating layer 110 to cover the gate patterns 160. The capping layer 172 may include a material substantially the same as, or similar to, that of the tunnel insulating layer 110.

The capping layer 172 may have a uniform thickness along profiles of the tunnel insulating layer 110 and the gate patterns 160. The capping layer 172 may have a thickness greater than that of the capping layer 170 in FIG. 8. Further, a trench 172 may be formed in the capping layer 172 between the adjacent gate patterns 160.

Figure 15A:
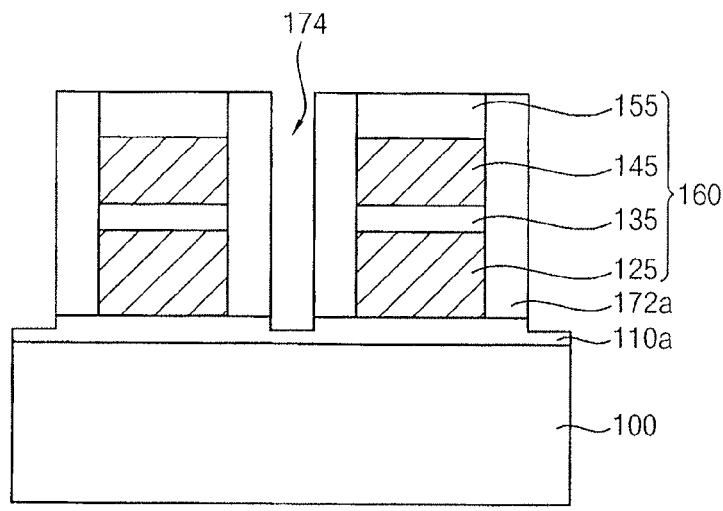

Referring to FIG. 15A, processes substantially the same as, or similar to, those illustrated with reference to FIG. 9A may be performed. Thus, the capping layer 172 and the tunnel insulating layer 110 may be etched to form a capping layer pattern 172a and a tunnel insulating layer pattern 110a.

An upper portion of the tunnel insulating layer 110 exposed between the capping layer patterns 172a may be partially removed to form the tunnel insulating layer pattern 110a.

Figure 15B:
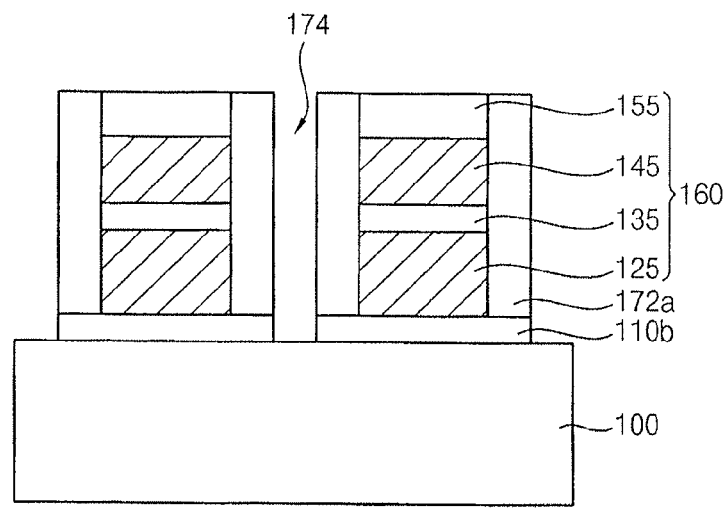

Referring to FIG. 15B, processes substantially the same as, or similar to, those illustrated with reference to FIG. 9B may be performed. Thus, the capping layer 172 and the tunnel insulating layer 110 may be etched to form a capping layer pattern 172a and a tunnel insulating layer pattern 110b.

The tunnel insulating layer 110 exposed between the capping layer patterns 172a may be completely removed to form the tunnel insulating layer pattern 110b. Thus, the upper surface of the substrate 100 may be exposed. Further, the tunnel insulating layer patterns 110b may have isolated shapes spaced apart from each other in the first direction.

Figure 16A:
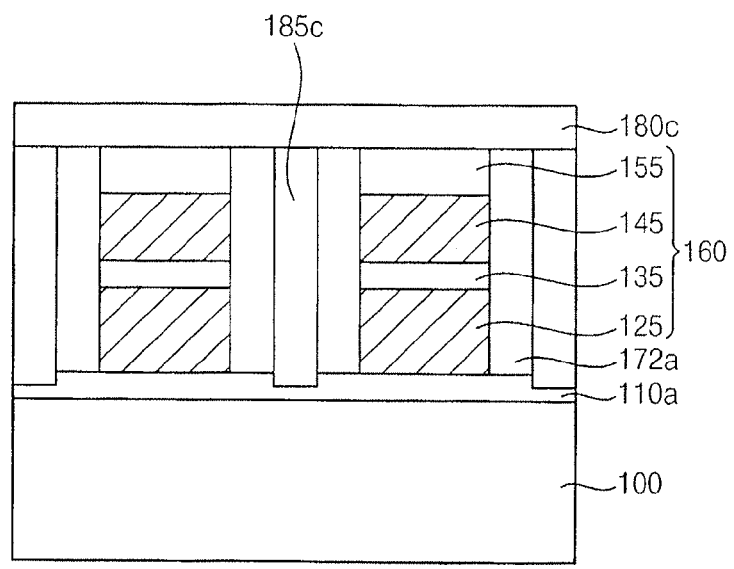

Referring to FIG. 16A, an insulating layer 180c may be formed on the gate patterns 160 and the capping layer patterns 172a to cover the trench 174. Thus, an air gap 185c may be formed in the insulating layer 180c between the capping layer patterns 172a, and between the tunnel insulating layer patterns 110a.

The insulating layer 180c may include an insulating material having low step coverage characteristic. Thus, the insulating layer 180c may overhang the capping layer patterns 172a. The insulating layer 180c may be formed by a CVD process, a PECVD process, an LPCVD process, etc., and the process may use a silicon oxide such as, e.g., TEOS, PE-TEOS, USG, etc.

The air gap 185c may be defined by the insulating layer 180c, the capping layer patterns 172a, and the tunnel insulating layer patterns 110a. The air gap 185c may have a bottom lower than the lower surface of the floating gate 125, and thus a parasitic capacitance and/or a tunnel coupling between the adjacent floating gates 125 may be substantially prevented.

Figure 16B:
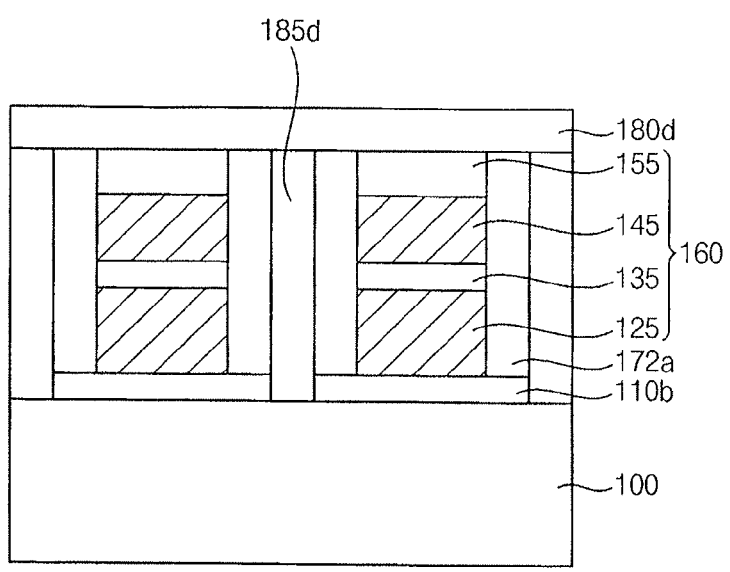

Referring to FIG. 16B, an insulating layer 180d may be formed on the gate patterns 160 and the capping layer patterns 172a to cover the trench 174. Thus, an air gap 185d may be formed in the insulating layer 180c between the capping layer patterns 172a, and between the tunnel insulating layer patterns 110a.

The insulating layer 180d may include an insulating material having low step coverage characteristic. Thus, the insulating layer 180d may overhang the capping layer patterns 172a. The insulating layer 180d may be formed by a CVD process, a PECVD process, an LPCVD process, etc., and the process may use a silicon oxide such as, e.g., TEOS, PE-TEOS, USG, etc.

The air gap 185d may be defined by the insulating layer 180d, the capping layer patterns 172a, the tunnel insulating layer patterns 110b, and the substrate 100. The air gap 185d may have a bottom lower than the lower surface of the floating gate 125, and thus a parasitic capacitance and/or a tunnel coupling between the adjacent floating gates 125 may be substantially prevented.

The insulating layers 180c and 180d may be planarized. A protecting layer (not shown) may be formed on the planarized insulating layers 180c and 180d. An insulating interlayer (not shown) may cover the protecting layer and/or the insulating layers 180c and 180d. A bit line contact (not shown) may be formed through the insulating interlayer, the protecting layer and the insulating layers 180c and 180d. The bit line contact may make contact with the substrate 100. A bit line (not shown) may be formed on the insulating interlayer. The bit line may make contact with the bit line contact.

Figure 17:
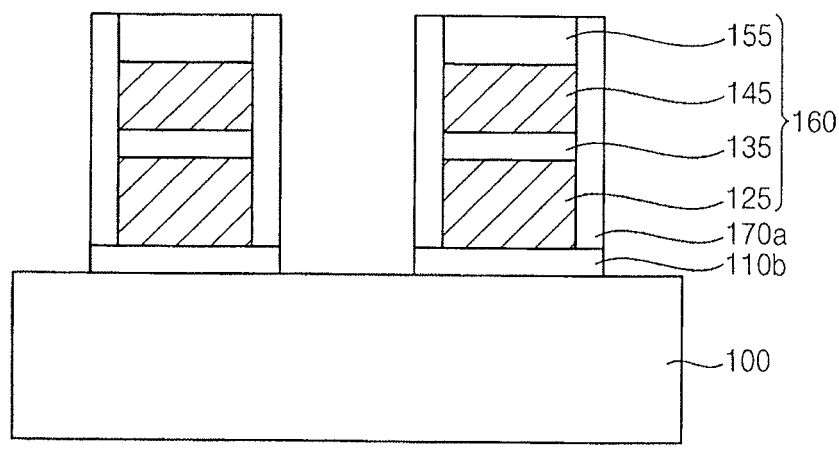
FIGS. 17 to 19 illustrate cross-sectional views of a method of manufacturing a semiconductor device according to an embodiment.
Figure 18:
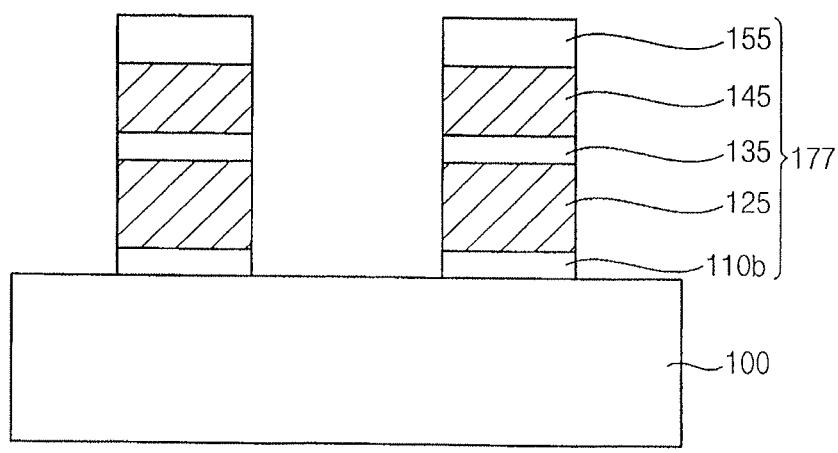
Figure 19:
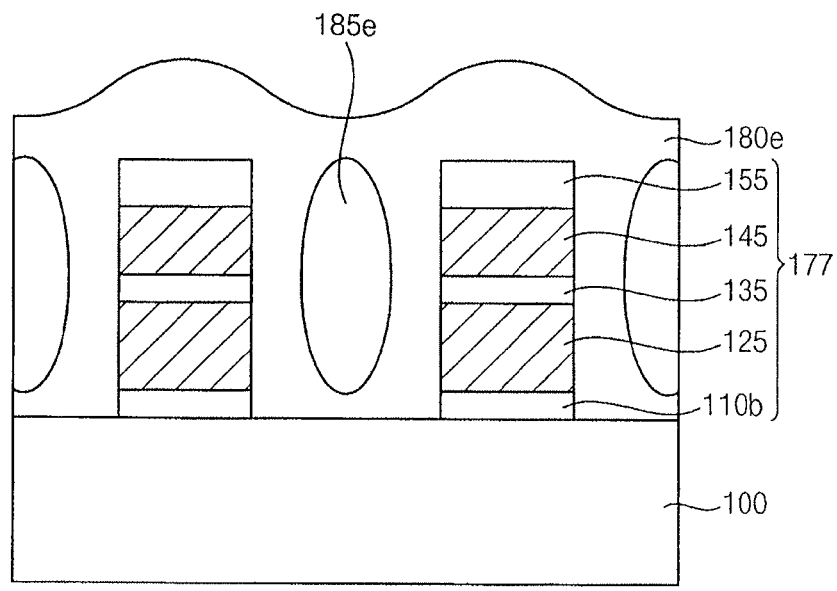

FIGS. 17 to 19 illustrate cross-sectional views of a method of manufacturing the semiconductor device in FIG. 4 according to an embodiment.

Referring to FIG. 17, processes substantially the same as, or similar to, those illustrated with reference to FIGS. 6 to 8 may be performed to form gate patterns 160 and capping layer patterns 170a. The gate patterns 160 may be formed on the tunnel insulating layer patterns 110b. The capping layer patterns 170a may be formed on the sidewalls of the gate patterns 160 and the upper surfaces of the tunnel insulating layer patterns 110b.

Referring to FIG. 18, the capping layer patterns 170a and portions of the tunnel insulating layer patterns 110b under the capping layer patterns 170a may be removed. The portions of the tunnel insulating layer patterns 110b under the capping layer patterns 170a may be removed wholly or partially. Thus, a gate structure 177 may be formed on the substrate 100. The gate structure 177 may include the tunnel insulating layer patterns 110b, the floating gate 125, the dielectric layer pattern 135, the control gate 145, and the hard mask 155.

The capping layer patterns 170a and the portions of the tunnel insulating layer patterns 110b may be removed by a wet etching process using an etching solution having an etching selectivity with respect to silicon oxide. For example, the etching solution may include an HF solution, a BOE solution, etc.

Referring to FIG. 19, processes substantially the same as, or similar to, those illustrated with reference to FIGS. 10A and 10B may be performed to form an insulating layer 180e on the substrate 100. The insulating layer 180e may cover the gate structure 177. An air gap 185e may be formed in the insulating layer 180e between the adjacent gate structures 177.

Portions of the tunnel insulating layer 110 under the capping layer patterns 170a between the adjacent gate structures 177 may be removed, and thus the air gap 185e may be sufficiently extended downwardly to substantially prevent a parasitic capacitance and/or a tunnel coupling between the floating gates 125 from being generated.

The bottom of the air gap 185e may be lower than at least the upper surface of the floating gate 125. Particularly, the bottom of the air gap 185e may be lower than the lower surface of the floating gate 125. Further, the air gap 185e may have a top higher than at least the lower surface of the control gate 145. Particularly, the top of the air gap 185e may be higher than the upper surface of the control gate 145.

The insulating layer 180e may be planarized. A protecting layer (not shown) may be formed on the planarized insulating layer 180e. An insulating interlayer (not shown) may cover the protecting layer and/or the insulating layer 180e. A bit line contact (not shown) may be formed through the insulating interlayer, the protecting layer and the insulating layer 180e. The bit line contact may make contact with the substrate 100. A bit line (not shown) may be formed on the insulating interlayer. The bit line may make contact with the bit line contact.

FIGS. 20 to 23, 24A, and 24B illustrate cross-sectional views of a method of manufacturing the semiconductor devices in FIGS. 5A and 5B according to an embodiment.

Figure 20:
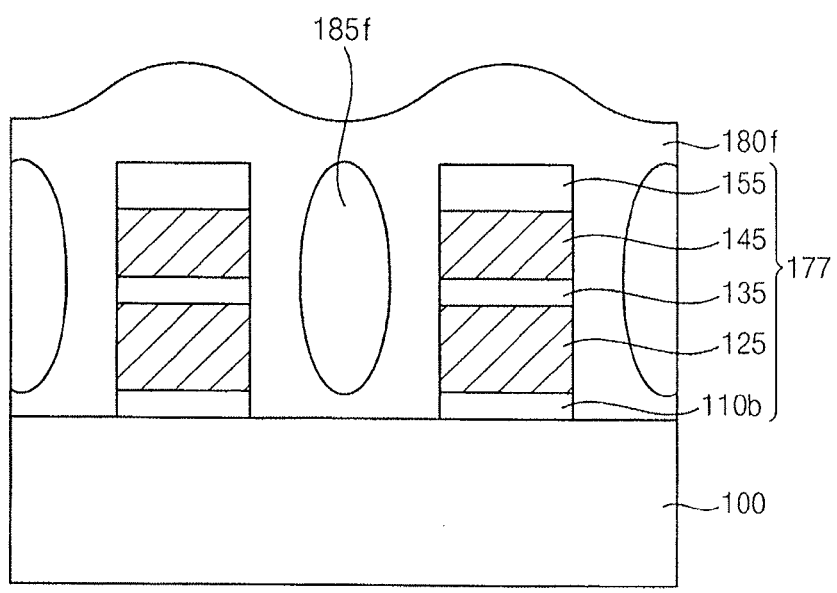
FIGS. 20 to 23, 24A, and 24B illustrate cross-sectional views of a method of manufacturing a semiconductor device according to an embodiment.

Referring to FIG. 20, processes substantially the same as, or similar to, those illustrated with reference to FIGS. 17 to 19 may be performed to form gate structures 177 on the substrate 100. A first insulating layer 180f may be formed on the substrate 100 to cover the gate structures 177. An air gap 185f may be formed in the insulating layer 180f between the adjacent gate structures 177.

Figure 21:
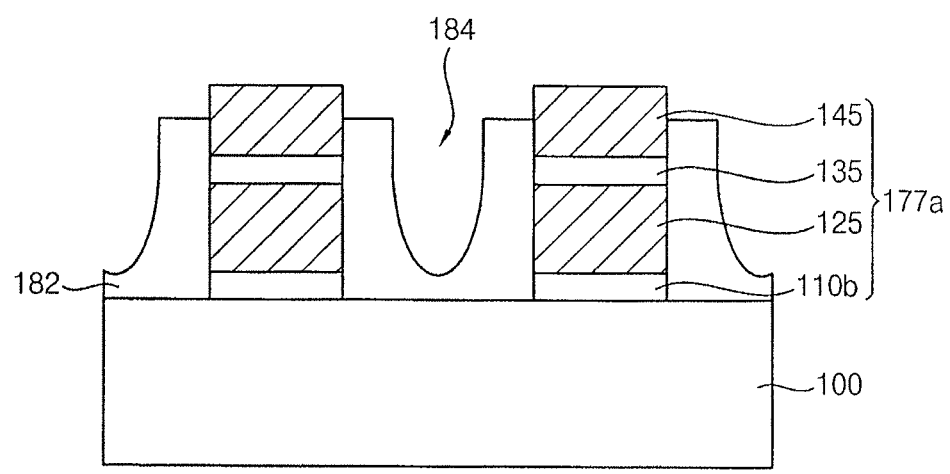

Referring to FIG. 21, a portion of the first insulating layer 180f may be removed by an etch-back process to form a first insulating layer pattern 182 having an opening configured to expose the control gate 145. That is, the first insulating layer pattern 182 may be formed on a partial sidewall of the gate structure 177a (which may have the hard mask 155 removed) and the upper surface of the substrate 100. The first insulating layer patterns 182 may cover at least sidewalls of the tunnel insulating layer patterns 110b, the floating gate 125, and the dielectric layer pattern 135. Additionally, the first insulating layer pattern 182 may partially cover a lower sidewall of the control gate 145. An upper portion of the control gate 145 may be doped with polysilicon.

The hard mask 155 may be removed together with the first insulating layer 180f. Further, a recess 184 may be formed in the first insulating layer pattern 182 between the gate structures 177a by removing the first insulating layer 180f.

Figure 22:
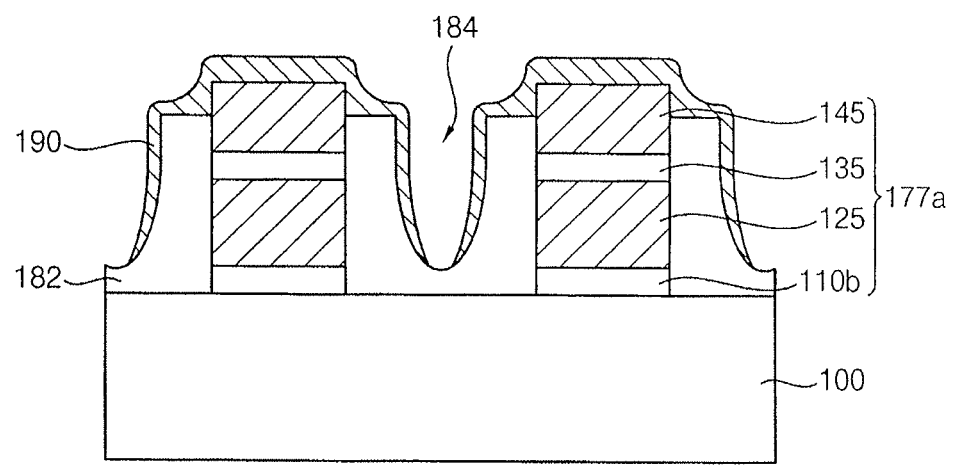

Referring to FIG. 22, a conductive layer 190 may be formed on the first insulating layer pattern 182 and the exposed portions of the control gate 145.

The conductive layer 190 may be formed by a PVD process, a sputtering process, an ALD process, etc., and the process may use a metal such as, e.g., cobalt, nickel, etc.

Figure 23:
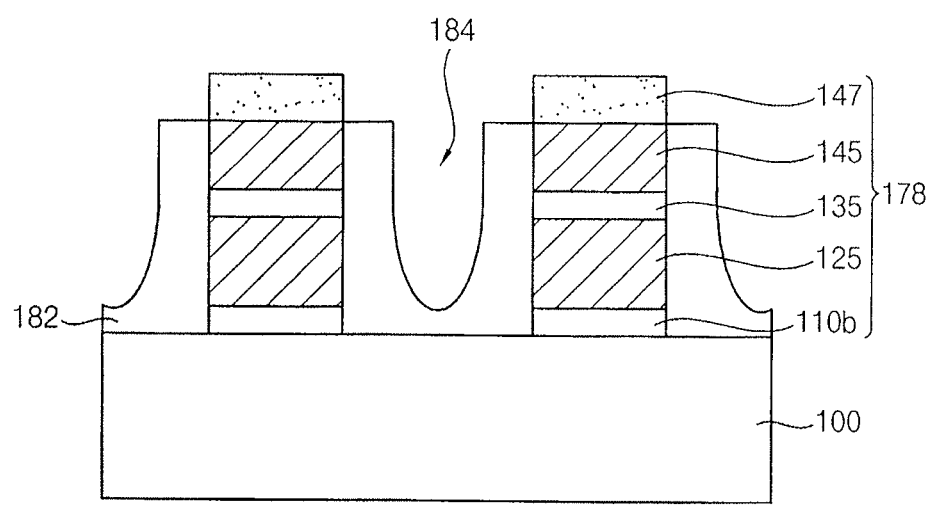

Referring to FIG. 23, the exposed portions of the control gate 145 may be reacted with the conductive layer 190 to form a conductive layer pattern 147 including a metal silicide. That is, the upper exposed portion of the control gate 145 may be converted into the conductive layer pattern 147. The conductive layer patterns 147 may be formed by a thermal silicidation process. If the conductive layer 190 includes, for example, cobalt, the conductive layer pattern 147 may include cobalt silicide. If the conductive layer 190 includes, for example, nickel, the conductive layer pattern 147 may include nickel silicide. During the reaction process, the first insulating layer pattern 182 may function as a reaction-limiting layer.

If the upper portion of the control gate 145 is converted into the conductive layer pattern 147 by the silicidation process, the control gate 145 may have a lower resistance, and thus a memory device including the control gate 145 may have improved operational characteristics.

Non-reacted portions of the conductive layer 190 remaining on the first insulating layer pattern 182 may be removed. The non-reacted portions of the conductive layer 190 may be removed by a strip process using a sulfuric acid solution, a hydrogen peroxide solution, etc., having an etching selectivity with respect to a metal.

Figure 24A:
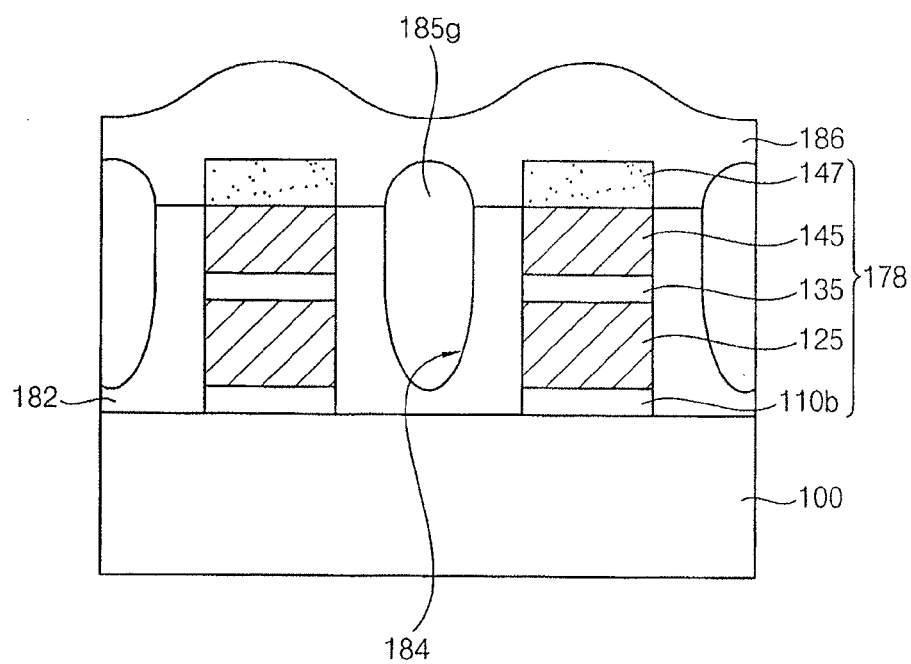

Referring to FIG. 24A, a second insulating layer 186 may be formed on the first insulating layer pattern 182 to cover the conductive layer pattern 147. The second insulating layer 186 may be formed on a sidewall and an upper surface of the conductive layer pattern 147.

The second insulating layer 186 may be formed by a CVD process, a PECVD process, an LPCVD process, etc., and the process may use an insulating material having low step coverage characteristic. The second insulating layer 186 may include a material substantially the same as that of the first insulating layer pattern 182. Thus, the second insulating layer 186 may include a silicon oxide such as, e.g., TEOS, PE-TEOS, USG, etc. Alternatively, the second insulating layer 186 may include a material having a low dielectric constant such as, e.g., SiOF, SiOC, SiBN, SIBCN, etc.

After forming the second insulating layer 186, a second air gap 185g may be formed between the adjacent gate structures 178. That is, the second air gap 185g may have an upper portion defined by the second insulating layer 186, and a lower portion defined by the recess 184 of the first insulating layer pattern 182.

Figure 24B:
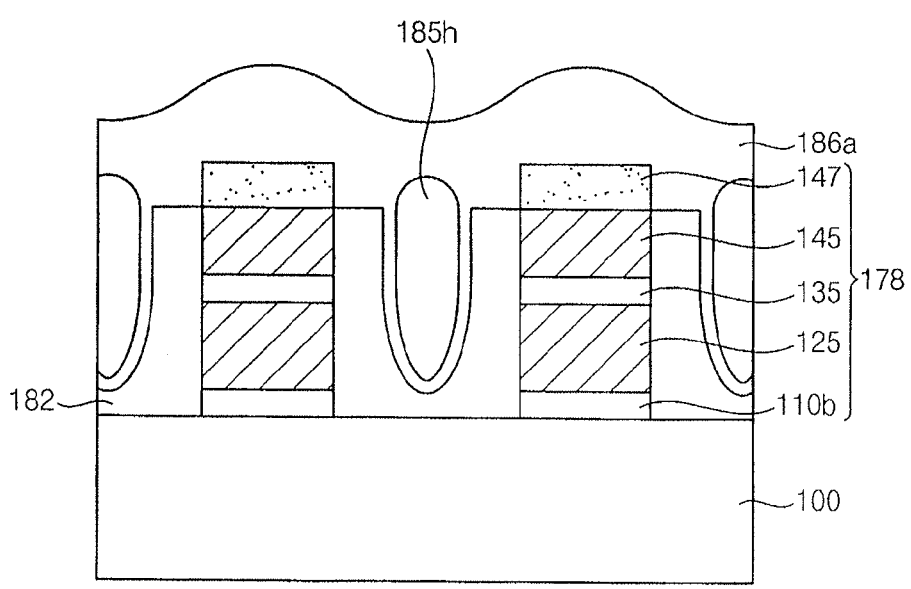

Referring to FIG. 24B, a second insulating layer 186a may be formed on the upper surface of the first insulating layer pattern 182 and an inner surface of the recess 184. Thus, an air gap 185h may be formed in the second insulating layer 186a. That is, the air gap 185h may be defined by only the second insulating layer 186a.

The insulating layers 186 and 186a may be planarized. A protecting layer (not shown) may be formed on the planarized insulating layers 186 and 186a. An insulating interlayer (not shown) may cover the protecting layer and/or the insulating layers 186 and 186a. A bit line contact (not shown) may be formed through the insulating interlayer, the protecting layer and the insulating layers 186 and 186a. The bit line contact may make contact with the substrate 100. A bit line (not shown) may be formed on the insulating interlayer. The bit line may make contact with the bit line contact.

The tunnel insulating layer between the adjacent gate patterns may be removed to form a large space where the air gap may be to be formed. Thus, the parasitic capacitance between the adjacent floating gates may be substantially blocked by the air gap.

By way of summary and review, if a semiconductor device is highly integrated, a distance between gate structures or word lines may be reduced. Thus, a parasitic capacitance or a channel coupling may be generated between the gate structures or the word lines. This may cause changes of threshold voltages in the gate structures, so that the semiconductor device may have relatively poor operational characteristics and reduced reliability. Therefore, methods of preventing the parasitic capacitance and/or the channel coupling may be desirable.

To this end, according to embodiments, an air gap may be provided between gate patterns. In particular, the air gap may be formed in a relatively large space by removing portions of the tunnel insulating layer and/or substrate at a location where the air gap is to be formed. As a result, the air gap may have a relatively large size (e.g., the air gap may have a bottom that is lower than the bottom of the floating gates in the gate patterns), and thus a parasitic capacitance and/or a tunnel coupling between the gate patterns may be substantially prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate extended in a first direction, comprising an active region and a field region;
a plurality of gate structures arranged spaced apart from each other in the first direction on the substrate, each gate structure comprising:
a gate insulating layer pattern on an upper surface of the substrate; and
a gate electrode on an upper surface of the gate insulating layer pattern,
wherein the gate insulating layer pattern includes an extended portion protruding away from the sidewall of the gate electrode, and
wherein the extended portion of the of the gate insulating layer pattern has an upper surface and a side surface,
a capping layer pattern on a sidewall of each gate electrode and on the upper surface of the extended portion of each gate insulating layer pattern;
a trench exposing a sidewall of the capping layer pattern between the gate structures, wherein the trench has a bottom portion lower than the upper surface of the substrate;
an insulating layer on the gate structures and the trench;
a protecting layer on the insulating layer; and
an air gap surrounded by the insulating layer between the gate structures,
wherein a portion of the insulating layer is formed along the sidewall of each gate structure to cover the sidewall of the gate structure between the gate structure and the air gap,
wherein the insulating layer has a planarized upper surface, and
wherein a bottom of the air gap is higher than a bottom surface of the gate insulating layer.

2. The semiconductor device as claimed in claim 1, wherein:
each gate electrode includes at least one of a polysilicon, a metal, a metal nitride and a metal silicide.

3. The semiconductor device as claimed in claim 1, wherein:
each gate structure further comprising a metal silicide on the gate electrode.

4. The semiconductor device as claimed in claim 3, wherein:
the metal silicide includes at least one of a cobalt silicide and a nickel silicide.

5. The semiconductor device as claimed in claim 1, wherein:
each gate structure further comprising a hard mask.

6. The semiconductor device as claimed in claim 5, wherein:
the hard mask includes at least one of a silicon nitride and a silicon oxynitride.

7. The semiconductor device as claimed in claim 1, wherein:
the gate insulating patterns of the gate structures have an isolated shape spaced apart from each other in the first direction.

8. A semiconductor device, comprising:
a substrate extended in a first direction, comprising an active region and a field region;
a plurality of gate structures arranged spaced apart from each other in the first direction on the substrate, each gate structure comprising:
a gate insulating layer pattern on an upper surface of the substrate; and
a gate electrode on an upper surface of the gate insulating layer pattern,
wherein a sidewall of the gate insulating layer pattern is aligned with a sidewall of the gate electrode,
a trench in the substrate and between the gate structures,
wherein the trench has a bottom portion lower than the upper surface of the substrate;
an insulating layer on the gate structures and the trench;
a protecting layer on the insulating layer; and
an air gap surrounded by the insulating layer between the gate structures,
wherein a portion of the insulating layer is formed along the sidewall of each gate structure to cover the sidewall of the gate structure between the gate structure and the air gap,
wherein the insulating layer has a planarized upper surface, and
wherein a bottom of the air gap is higher than a bottom surface of the gate insulating layer.

9. The semiconductor device as claimed in claim 8, wherein:
each gate electrode includes at least one of a polysilicon, a metal, a metal nitride and a metal silicide.

10. The semiconductor device as claimed in claim 8, wherein:
each gate structure further comprising a metal silicide on the gate electrode.

11. The semiconductor device as claimed in claim 10, wherein:
each metal silicide includes at least one of a cobalt silicide and a nickel silicide.

12. The semiconductor device as claimed in claim 8, wherein:
each gate structure further comprising a hard mask.

13. The semiconductor device as claimed in claim 12, wherein:

the hard mask includes at least one of a silicon nitride and a silicon oxynitride.

14. The semiconductor device as claimed in claim 8, wherein:
the gate insulating patterns of the gate structures have an isolated shape spaced apart from each other in the first direction.

15. The semiconductor device as claimed in claim 1, wherein:
the insulating layer includes a first insulating layer and a second insulating layer on the first insulating layer.

16. The semiconductor device as claimed in claim 8, wherein:
the insulating layer includes a first insulating layer and a second insulating layer on the first insulating layer.

* * * * *